United States Patent [19]
Kwon

[11] Patent Number: 5,883,540
[45] Date of Patent: Mar. 16, 1999

[54] ELECTROSTATIC PROTECTION CIRCUIT OF AN INPUT/OUTPUT CIRCUIT OF A SEMICONDUCTOR DEVICE

[75] Inventor: Kyu-Hyung Kwon, Kyungki-do, Rep. of Korea

[73] Assignee: Samsung Electronics Co., Ltd., Suwon, Rep. of Korea

[21] Appl. No.: 826,594

[22] Filed: Apr. 3, 1997

[30] Foreign Application Priority Data

Apr. 3, 1996 [KR] Rep. of Korea ................... 1996 9993

[51] Int. Cl.[6] .................................................. H03K 17/16
[52] U.S. Cl. ......................... 327/379; 327/310; 327/319; 327/389
[58] Field of Search .................................... 327/309, 310, 327/313, 314, 318, 319, 320, 321, 324, 325, 327, 328, 333, 379, 389

[56] References Cited

U.S. PATENT DOCUMENTS

| | | | |
|---|---|---|---|
| 4,691,217 | 9/1987 | Ueno et al | 327/328 |
| 5,574,395 | 11/1996 | Kusakabe | 327/314 |
| 5,705,941 | 1/1998 | Fukazawa et al. | 327/314 |

Primary Examiner—Timothy P. Callahan
Assistant Examiner—Jeffrey Zweizig
Attorney, Agent, or Firm—Jones & Volentine, L.L.P.

[57] ABSTRACT

An electrostatic protection circuit in a internal circuit isolated from a substrate bias which protects the internal circuit from static electricity with regard to any of three different sources of bias voltage. An electrostatic protection circuit is constructed for each source of bias voltage so that the internal circuit is protected from static electricity flowing through bonding pads of the isolated circuit. The protective circuit comprises a plurality of NMOS or PMOS transistors for protecting input/output buffers and drivers from the static electricity flowing through the bonding pads. The respective NMOS or PMOS transistors are connected to the respective source voltage terminals and the input/output drivers.

8 Claims, 4 Drawing Sheets

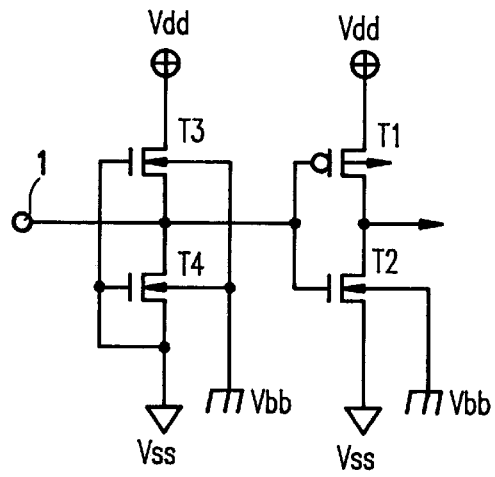
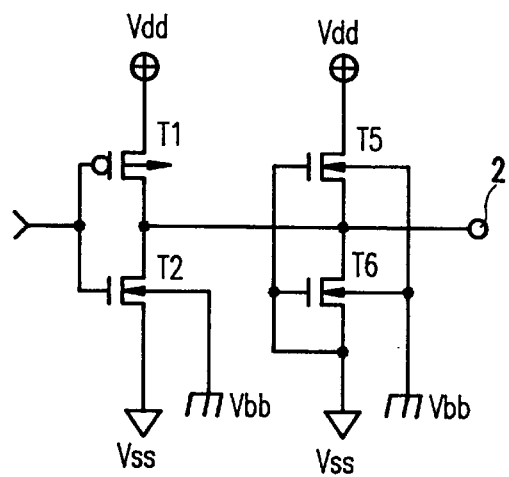
FIG.4A
PRIOR ART
FIG.4B
PRIOR ART
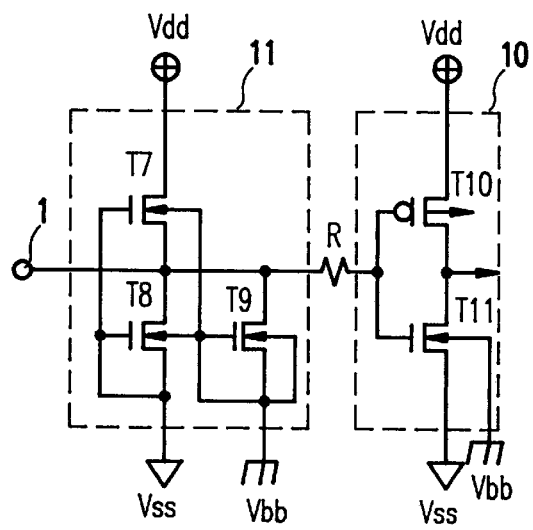
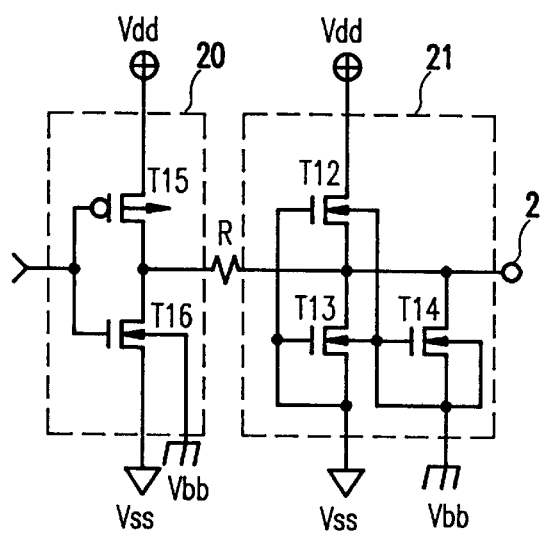
FIG.5A
FIG.5B

ELECTROSTATIC PROTECTION CIRCUIT OF AN INPUT/OUTPUT CIRCUIT OF A SEMICONDUCTOR DEVICE

BACKGROUND OF THE INVENTION

1. Field of the Invention

This invention relates to a electrostatic protection circuit for protecting against both positive and negative pulses of static electricity, and more particularly, to an electrostatic protection circuit for protecting against static electricity which may be applied from any source, including power supply terminals, by constructing respective protection circuits for each power supply terminal so that an internal circuit can be protected from the static electricity flowing thereto through bonding pads.

2. Description of the Related Art

In conventional complementary metal oxide semiconductor (CMOS) analog circuits, the substrate bias or voltage and the source bias or voltage of the transistor are isolated from each other in an effort to reduce noise, as shown in the input buffer (or load) and an output driver circuits in FIGS. 1A and 1B, respectively.

The CMOS analog circuits operate in the following manner when a pulse of static electricity is applied through bonding pads 1 and 2.

First, when a reference power supply terminal Vdd is grounded and a positive pulse is applied to the bonding pads 1 and 2, the region between a $p^+$-type drain of the PMOS transistor T1 and an $n^-$-type well is forward-biased, and thus exhibits good electrostatic protection, assuming the transistor T1 has sufficient discharging capacity.

When a negative pulse is applied to the bonding pads 1 and 2, the static electricity will be discharged through either a pnp-type bipolar junction transistor (BJT), formed between source and drain regions and an $n^-$-type well region of the PMOS transistor T1, or a protective element formed between a reference power supply terminal Vdd and an NMOS transistor T2 coupled to a reference ground terminal Vss. The particular discharge path is determined by the level of the operating voltage of the BJT and the protective element.

Second, when the source bias or reference ground terminal Vss of the NMOS transistor T2 is grounded and a negative pulse is applied to the bonding pads 1 and 2, the degree of electrostatic protection is proportional to the size of transistor T2 since the substrate is biased by the substrate voltage Vbb. The PMOS transistor T1 does not operate as a diode coupled between an $n^+$-type drain and a $p^-$-type substrate, causing the transistor T2 to function as a npn-type BJT.

When a positive pulse is applied to the bonding pads 1 and 2, there is excellent electrostatic protection since the npn-type BJT operates at its breakdown voltage BVceo state, i.e., in an open-circuit state.

Third, when the substrate voltage Vbb is grounded and a negative pulse of static electricity is applied to the bonding pads 1 and 2, there is excellent electrostatic protection since the $n^+/p^-$ type diode formed between an $n^{30}$-type drain and a $p^-$-type substrate region operates in a forward-biased state.

When a positive pulse is applied to the bonding pads 1 and 2, a parasitic BJT is not formed because the source of the transistor, which is an emitter region of the parasitic BJT, is open-circuited. Thus, electrostatic protection deteriorates since the static electricity is discharged by the $n^+/p^-$ diode feature (see FIG. 3) without utilization of the snap-back phenomenon, which is the major operational mechanism for discharging the static electricity (see FIG. 2).

FIGS. 4A and 4B illustrate conventional electrostatic protection circuits provided in the respective input driver and output buffer circuits. In FIGS. 4A and 4B, the PMOS transistor T1 acts as the input buffer, while the NMOS transistor T2 acts as the output driver. Each pair of NMOS transistors T3, T4 and T5, T6, which are connected to the input buffer and the output driver, respectively, represent protective elements for protecting the internal circuit against static electricity applied from a voltage source of the circuit.

The NMOS transistors T3 and T5 act as the electrostatic protection circuits for the reference power supply terminal Vdd. Transistors T3 and T5 have their respective sources connected to the reference power supply terminal Vdd, their respective drains to the bonding pads 1 and 2, and their respective gates to the reference ground terminal Vss. The substrate is biased by the substrate voltage Vbb.

The NMOS transistors T4 and T6 act as the electrostatic protection circuits for the reference ground terminal Vss. Transistors T4 and T6 have their respective sources connected to the reference ground terminal Vss, their respective drains to the bonding pads 1 and 2, and their respective gates to the reference ground terminal Vss. The substrate is biased by the substrate voltage Vbb.

The operation of these conventional electrostatic protection circuits will now be described. When the source biases comprising the reference ground terminal Vss and the substrate voltage Vbb are grounded, the static electricity will be discharged in the same manner as described in the second and third situations above.

When the reference power supply terminal Vdd is grounded and a negative pulse is applied, the NMOS transistors T3 and T5 discharge the static electricity by the operation of the parasitic BJT. If a positive pulse is applied, the NMOS transistors T3 and T5 operate at the breakdown voltage BVceo. The PMOS transistor T1 forms a $p^+/n^-$-type diode between the drain and the n-type well thereof, and thus discharges the overflow current caused by the static electricity at a lower voltage than in the NMOS transistor T2.

Thus, excellent electrostatic protection can be obtained under the condition that the size of the PMOS transistor is large enough to discharge the overflow current applied thereto. If, however, the PMOS transistor is too small, several problems may occur.

Therefore, the conventional electrostatic protection circuits shown in FIGS. 4A and 4B are limited to use in those situations where the PMOS transistor is large enough to satisfy the electrostatic discharge (ESD) standards.

SUMMARY OF THE INVENTION

Accordingly, it is an object of the present invention to provide an electrostatic protection circuit which is isolated from a substrate bias, which has good electrostatic discharge capabilities regardless of the source bias, in order to protect an internal circuit from static electricity applied through the bonding pads.

To achieve this and other objects, the present invention provides an electrostatic protection circuit of an input/output buffer circuit of a semiconductor device, the input/output buffer circuit comprising: a first transistor having a source coupled to a first power voltage, a drain coupled to a first common node, and a gate coupled to a second common node; and a second transistor having a source coupled to a second power voltage, a drain coupled to the first common node, a gate coupled to the second common node, and a channel region coupled to a ground voltage which is isolated from the second power voltage, either of the first and second common nodes being coupled to an input/output pad comprising: a third transistor having a drain coupled to the first power voltage, a source coupled to either of the first and second common nodes, a gate coupled to the second power voltage, and a channel region coupled to the ground voltage; a fourth transistor having a source coupled to the second power voltage, a drain coupled to either of the first and second common nodes, a gate coupled to the second power voltage, and a channel region coupled to the ground voltage; and a fifth transistor having a source coupled to the ground voltage, a drain coupled to either of the first and second common nodes, a gate coupled to the second power voltage, and a channel region coupled to the ground voltage. Each of the third, fourth and fifth transistors is an NMOS transistor.

In another aspect, the present invention provides an electrostatic protection circuit of an input/output buffer circuit of a semiconductor device, the input/output buffer circuit comprising: a first transistor having a source coupled to a first power voltage, a drain coupled to a first common node, and a gate coupled to a second common node; and a second transistor having a source coupled to a second power voltage, a drain coupled to the first common node, a gate coupled to the second common node, and a channel region coupled to a ground voltage which is isolated from the second power voltage, either of the first and second common nodes being coupled to an input/output pad comprising: a third transistor having a source coupled to the first power voltage, a drain coupled to either of the first and second common nodes, a gate coupled to the first power voltage, and a channel region coupled to the first power voltage; a fourth transistor having a drain coupled to the second power voltage, a source coupled to either of the first and second common nodes, a gate coupled to the first power voltage, and a channel region coupled to the first power voltage; and a fifth transistor having a source coupled to the first power voltage, a drain coupled to either of the first and second common nodes, a gate coupled to the first power voltage, and a channel region coupled to the first power voltage. Each of the third, fourth and fifth transistors is a PMOS transistor.

The electrostatic protection circuit of the present invention thus protects an internal circuit from static electricity applied through the bonding pads regardless of the source bias.

BRIEF DESCRIPTION OF THE DRAWINGS

The above object, other advantages and features of the present invention will become more apparent by describing the preferred embodiments thereof with reference to the accompanying drawings, in which:

FIGS. 1A and 1B are circuit diagrams illustrating a conventional CMOS circuit isolated from a substrate bias, wherein FIG. 1A depicts an input buffer and FIG. 1B an output driver;

FIGS. 4A and 4B are circuit diagrams illustrating a conventional CMOS circuit isolated from a substrate bias with an electrostatic protection circuit included for the respective input buffer in FIG. 4A and the output drive in FIG. 4B;

FIGS. 5A and 5B are circuit diagrams illustrating an electrostatic protection circuit comprising NMOS transistors according to one embodiment of the present invention, wherein FIG. 5A depicts an input buffer and FIG. 5B depicts an output driver; and FIGS. 6A and 6B are circuit diagrams illustrating an electrostatic protection circuit comprising PMOS transistors according to another embodiment of the present invention, wherein FIG. 6A depicts an input buffer and FIG. 6B depicts an output driver.

DETAILED DESCRIPTION OF PREFERRED EMBODIMENTS

Figure 1A:
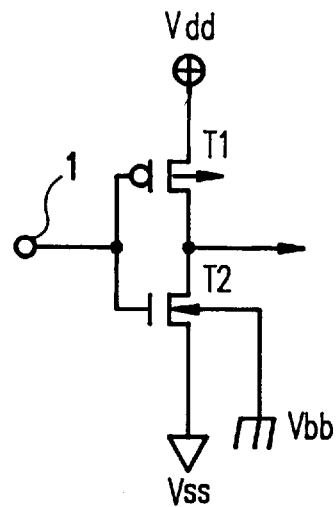
Figure 1B:
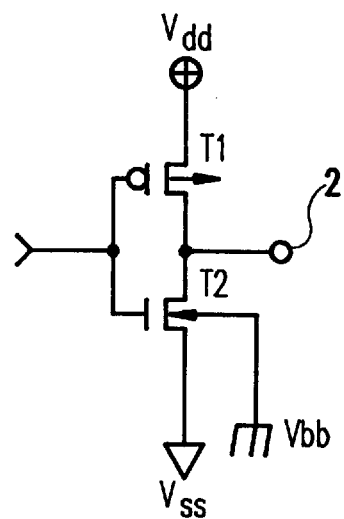
Figure 2:
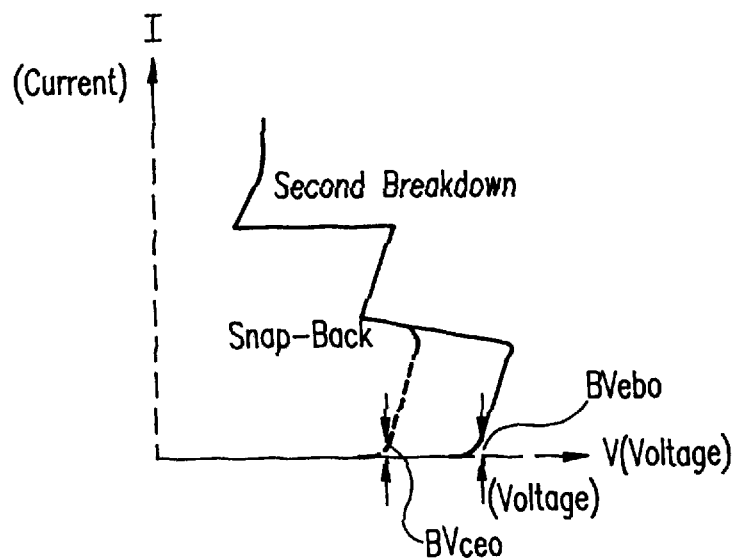
FIG. 2 is a current-voltage graph illustrating the situation when a reverse voltage is applied to a CMOS transistor.
Figure 3:
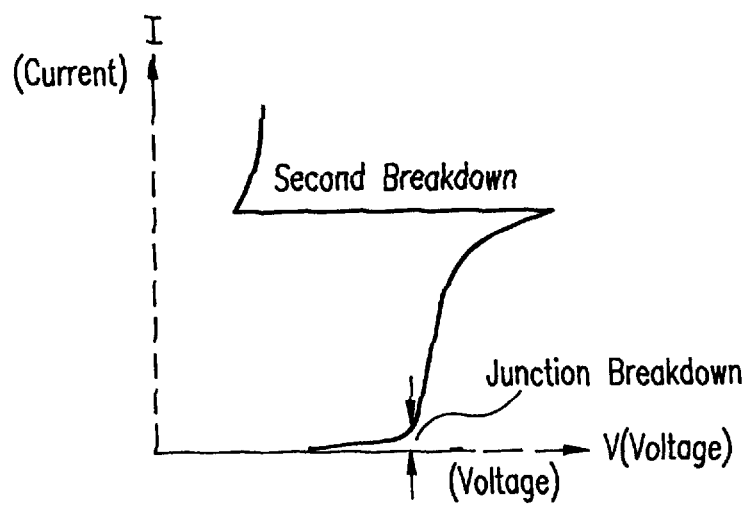
FIG. 3 is a current-voltage graph illustrating the situation when a reverse voltage is applied to a pn junction diode.

The construction and operation of embodiments of the present invention is described in detail with reference to FIGS. 5 and 6.

FIGS. 5A and 5B illustrate one embodiment of an electrostatic protection circuit consisting of three NMOS transistors. Referring to the drawings, PMOS transistors T10 and T15 act as input/output buffers while NMOS transistors T11 and T16 act as input/output drivers.

As shown in FIG. 5A, the protective circuit 11 comprises three NMOS transistors T7, T8 and T9, being connected between the bonding pad 1 and the input buffer 10. Transistors T7, T8 and T9 are respectively connected to the reference power supply terminal Vdd, reference ground terminal Vss, and the substrate voltage source Vbb, for protecting the input buffer 10 from static electricity applied through the bonding pad 1.

As shown in FIG. 5B, the protective circuit 21 comprises three NMOS transistors T12, T13 and T14, being connected between the bonding pad 2 and the output driver input buffer 20. Transistors T12, T13 and T14 are respectively connected to the reference power supply terminal Vdd, reference ground terminal Vss, and the substrate voltage source Vbb, for protecting the output driver 20 from static electricity applied through the bonding pad 2.

In general, NMOS transistors T7 and T12 act as the electrostatic protection elements for protecting an internal circuit when the reference power supply terminal Vdd is grounded and static electricity is applied. NMOS transistors T8 and T13 act as the electrostatic protection elements when the reference ground terminal Vss is grounded. Finally, NMOS transistors T9 and T14 act as the electrostatic protection elements when a substrate voltage Vbb of the NMOS transistor is grounded.

As shown in FIGS. 5A and 5B, the substrates of the three NMOS transistors are isolated and connected to an independent substrate voltage Vbb.

Figure 6A:
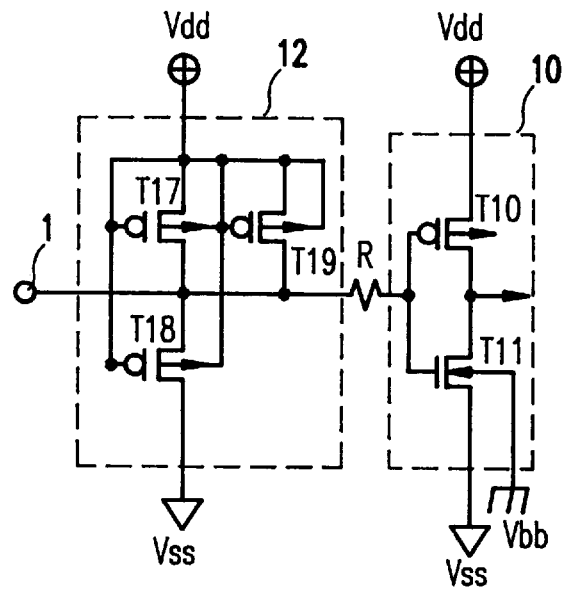
Figure 6B:
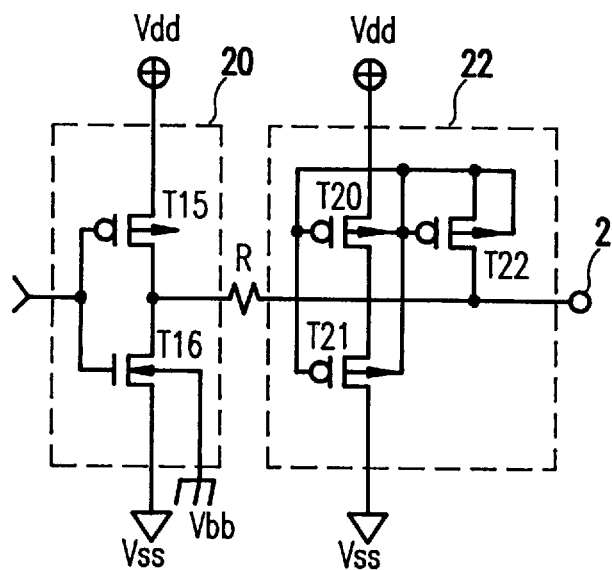

FIGS. 6A and 6B illustrate another embodiment of the present invention providing an electrostatic protection circuit consisting of three PMOS transistors.

As shown in FIG. 6A, the protective circuit 12 comprises three PMOS transistors T17, T18 and T19, being connected between the bonding pad 1 and the input buffer 10. Transistors T17 and T19 are connected to the reference power supply terminal Vdd, and transistor T18 is connected to the reference ground terminal Vss, for protecting the input buffer 10 from static electricity applied through the bonding pad 1.

As shown in FIG. 6B, the protective circuit 22 comprises three PMOS transistors T20, T21, and T22, being connected between the bonding pad 2 and the output driver 20. Transistors T20 and T22 are connected to the reference power supply terminal Vdd, and transistor T21 is connected to the reference ground terminal Vss, for protecting the output driver 20 from static electricity applied through the bonding pad 2.

FIGS. 5A, 5B, 6A, and 6B illustrate a resistor R that may be connected is series between the bonding pad 1 and the input buffer 10, or the bonding pad 2 and the output driver 20, to which the protective circuit 11, 12, 21, and 22 are connected.

The operation of the electrostatic protection circuit will now be described. Since the electrostatic protection elements operate in the same manner for the input and output terminals, only the operation of the input terminal will be fully explained.

First, when the reference power supply terminal Vdd is grounded and a negative pulse is applied to the bonding pad 1, the NMOS transistors T7 and T12 discharge the static electricity in the same operational manner as for the breakdown voltage BVceo of the parasitic BJT. Thus, the degree of protection from static electricity will be a function of the size of the transistor. When a positive pulse is applied, the static electricity is discharged smoothly because the NMOS transistors T7 and T12 operate in the same manner as for the breakdown voltage BVceo state.

Second, when the reference ground terminal Vss is grounded and a negative pulse is applied to the bonding pad 1, the electrostatic protection is excellent since the NMOS transistors T8 and T13 operate in the same way as the NMOS transistor T7 and T12.

Third, when the substrate voltage Vbb is grounded and a negative pulse is applied to the bonding pad 1, good electrostatic protection will be obtained if the transistor has sufficient discharge capacity, because the $n^+/p^-$ diode formed between the drains and the substrate of the NMOS transistors T9 and T14 is forward-biased.

When a positive pulse is applied, excellent electrostatic protection will be obtained because the npn BJT formed in regions containing the drains, sources, and the NMOS transistors T9 and T14 operate in the same manner as for the breakdown voltage BVceo state.

According to the present invention, therefore, excellent electrostatic protection can be obtained with respect to both positive and negative pulses of static electricity which are applied from any source including power supply terminals thereof, so that an internal circuit can be protected from the static electricity flowing thereto through bonding pads.

While the present invention has been described and illustrated herein with reference to the preferred embodiments thereof, it will be understood by those skilled in the art that various changes in form and details may be made therein without departing from the spirit and scope of the invention as set forth in the appended claims and their equivalents.

What is claimed is:

1. An electrostatic protection circuit of an input/output buffer circuit of a semiconductor device, said input/output buffer circuit comprising:
   a first transistor having a source coupled to a first power voltage, a drain coupled to a first common node, and a gate coupled to a second common node; and
   a second transistor having a source coupled to a second power voltage, a drain coupled to said first common node, a gate coupled to said second common node, and a channel region coupled to a ground voltage which is isolated from said second power voltage, the first common node being coupled to an input/output pad comprising:
   a third transistor having a drain coupled to said first power voltage, a source coupled to the first common node, a gate coupled to said second power voltage, and a channel region coupled to said ground voltage;
   a fourth transistor having a source coupled to said second power voltage, a drain coupled to the first common node, a gate coupled to said second power voltage, and a channel region coupled to said ground voltage; and
   a fifth transistor having a source coupled to said ground voltage, a drain coupled to the first common node, a gate coupled to said ground voltage, and a channel region coupled to said ground voltage.

2. An electrostatic protection circuit as claimed in claim 1, wherein each of said third, fourth and fifth transistors is an NMOS transistor.

3. An electrostatic protection circuit of an input/output buffer circuit of a semiconductor device, said input/output buffer circuit comprising:
   a first transistor having a source coupled to a first power voltage, a drain coupled to a first common node, and a gate coupled to a second common node; and
   a second transistor having a source coupled to a second power voltage, a drain coupled to said first common node, a gate coupled to said second common node, and a channel region coupled to a ground voltage which is isolated from said second power voltage, the first common node being coupled to an input/output pad comprising:
   a third transistor having a source coupled to said first power voltage, a drain coupled to the first common node, a gate coupled to said first power voltage, and a channel region coupled to said first power voltage;
   a fourth transistor having a drain coupled to said second power voltage, a source coupled to the first common node, a gate coupled to said first power voltage, and a channel region coupled to said first power voltage; and
   a fifth transistor having a source coupled to said first power voltage, a drain coupled to the first common node, a gate coupled to said first power voltage, and a channel region coupled to said first power voltage.

4. An electrostatic protection circuit as claimed in claim 3, wherein each of said third, fourth and fifth transitors is a PMOS transistor.

5. An electrostatic protection circuit of an input/output buffer circuit of a semiconductor device, the input/output buffer circuit comprising:
   a first transistor having a source coupled to a first power voltage, a drain coupled to a first common node, and a gate coupled to a second common node; and
   a second transistor having a source coupled to a second power voltage, a drain coupled to the first common node, a gate coupled to the second common node, and a channel region coupled to a ground voltage which is isolated from the second power voltage, the second common node being coupled to an input/output pad comprising:
   a third transistor having a drain coupled to the first power voltage, a source coupled to the second common node, a gate coupled to the second power voltage, and a channel region coupled to the ground voltage;
   a fourth transistor having a source coupled to the second power voltage, a drain coupled to the second common node, a gate coupled to the second power voltage, and a channel region coupled to the ground voltage; and a fifth transistor having a source coupled to the ground voltage, a drain coupled to the second common node, a gate coupled to the ground voltage, and a channel region coupled to the ground voltage.

6. An electrostatic protection circuit as claimed in claim 5, wherein each of the third, fourth and fifth transistors is an NMOS transistor.

7. An electrostatic protection circuit of an input/output buffer circuit of a semiconductor device, the input/output buffer circuit comprising:

a first transistor having a source coupled to a first power voltage, a drain coupled to a first common node, and a gate coupled to a second common node; and a second transistor having a source coupled to a second power voltage, a drain coupled to the first common node, a gate coupled to the second common node, and a channel region coupled to a ground voltage which is isolated from the second power voltage, the second common node being coupled to an input/output pad comprising:

a third transistor having a source coupled to the first power voltage, a drain coupled to the second common node, a gate coupled to the first power voltage, and a channel region coupled to the first power voltage;

a fourth transistor having a drain coupled to the second power voltage, a source coupled to the second common node, a gate coupled to the first power voltage, and a channel region coupled to the first power voltage; and a fifth transistor having a source coupled to the first power voltage, a drain coupled to the second common node, a gate coupled to the first power voltage, and a channel region coupled to the first power voltage.

8. An electrostatic protection circuit as claimed in claim 7, wherein each of the third, fourth and fifth transistors is a PMOS transistor.

* * * * *